(12) United States Patent
Murakami et al.

(10) Patent No.: US 9,708,466 B2
(45) Date of Patent: Jul. 18, 2017

(54) RESIN COMPOSITION FOR LASER PROCESSING

(71) Applicant: DAI-ICHI KOGYO SEIYAKU CO., LTD., Kyoto-shi, Kyoto (JP)

(72) Inventors: Satoshi Murakami, Kyoto (JP); Manabu Kikuta, Kyoto (JP)

(73) Assignee: DAI-ICHI KOGYO SEIYAKU CO., LTD., Kyoto (JP)

( * ) Notice: Subject to any disclaimer, the term of this patent is extended or adjusted under 35 U.S.C. 154(b) by 0 days.

(21) Appl. No.: 14/384,335

(22) PCT Filed: Feb. 20, 2013

(86) PCT No.: PCT/JP2013/054099
§ 371 (c)(1),
(2) Date: Sep. 10, 2014

(87) PCT Pub. No.: WO2013/136924
PCT Pub. Date: Sep. 19, 2013

(65) Prior Publication Data
US 2015/0065621 A1    Mar. 5, 2015

(30) Foreign Application Priority Data

Mar. 15, 2012  (JP) ................. 2012-058927

(51) Int. Cl.
| | | |
|---|---|---|
| C08L 25/14 | (2006.01) | |
| H05K 1/00 | (2006.01) | |
| H05K 3/00 | (2006.01) | |
| C08K 5/3475 | (2006.01) | |
| C08L 101/00 | (2006.01) | |
| C08K 5/00 | (2006.01) | |
| C08K 5/11 | (2006.01) | |
| C08K 5/12 | (2006.01) | |
| C08K 5/523 | (2006.01) | |
| H05K 1/03 | (2006.01) | |

(52) U.S. Cl.
CPC ............ *C08K 5/3475* (2013.01); *C08K 5/005* (2013.01); *C08K 5/11* (2013.01); *C08K 5/12* (2013.01); *C08K 5/523* (2013.01); *C08L 101/00* (2013.01); *H05K 1/03* (2013.01); *H05K 3/0011* (2013.01)

(58) Field of Classification Search
CPC ....................................................... C08L 25/14
See application file for complete search history.

(56) References Cited

U.S. PATENT DOCUMENTS

| | | | | |
|---|---|---|---|---|
| 5,262,275 A | * | 11/1993 | Fan ................... | G03F 7/202 430/271.1 |
| 5,925,900 A | * | 7/1999 | Amaratunga ....... | H01L 29/7436 257/147 |
| 6,004,705 A | | 12/1999 | Masaki et al. | |
| 6,773,859 B2 | * | 8/2004 | Fan ................... | B41C 1/055 430/200 |
| 2003/0170568 A1 | * | 9/2003 | Misev ............... | G03F 7/027 430/281.1 |
| 2007/0036953 A1 | | 2/2007 | Nonaka et al. | |
| 2011/0003914 A1 | | 1/2011 | Yokota et al. | |
| 2013/0337188 A1 | | 12/2013 | Konno et al. | |

FOREIGN PATENT DOCUMENTS

| | | |
|---|---|---|
| CN | 1539903 | 10/2004 |
| CN | 102197323 | 9/2011 |
| EP | 1 046 670 | 10/2000 |
| EP | 2 671 919 | 12/2013 |
| JP | 6-305814 | 11/1994 |
| JP | 2009-206116 | 9/2009 |
| JP | 2009-206117 | 9/2009 |
| JP | 2009-206118 | 9/2009 |
| JP | 2010-135768 | 6/2010 |
| JP | 2012-241149 | 12/2012 |
| WO | 2009/096507 | 8/2009 |

OTHER PUBLICATIONS

Japanese Notification of Reasons for Refusal, issued on May 19, 2015, in corresponding Japanese Appln. No. 2012-058927, and English translation thereof.
International Search Report for PCT/JP2013/054099, dated May 7, 2013.
Office Action issued Dec. 1, 2015, in corresponding Japanese application No. 2012-058927 with English translation.
First Office Action issued Sep. 6, 2015 in corresponding Chinese Application No. 201380014078.2 (with English translation).
Extended European Search Report issued Oct. 8, 2015 in corresponding European Application No. 13760488.0.

* cited by examiner

*Primary Examiner* — Brieann R Fink
(74) *Attorney, Agent, or Firm* — Wenderoth, Lind & Ponack, L.L.P.

(57) ABSTRACT

A resin composition for laser processing which is able to enhance laser processability with maintaining a resist performance of a resin after ultraviolet laser processing, and which can be, for example, used as a resist in forming a circuit of a printed wiring board is provided.
Disclosed is a resin composition for laser processing containing a resin and an ultraviolet absorber, wherein the resin is a thermoplastic resin having a carboxyl group and having a softening temperature of from 70 to 140° C., and a content of the ultraviolet absorber is from 1 to 30 parts by mass based on 100 parts by mass of the thermoplastic resin.

7 Claims, No Drawings

RESIN COMPOSITION FOR LASER PROCESSING

TECHNICAL FIELD

The present invention relates to a resin composition for laser processing, and in more detail, the present invention relates to a resin composition for laser processing which can be, for example, used as a resist in forming a circuit of a printed wiring board.

BACKGROUND ART

In recent years, progress of electrical equipment such as portable information terminal equipment including mobile phones, computers and peripheral equipment thereof, various information home appliances, etc. is remarkable, and high functionality, size reduction, and increase in speed are rapidly advanced.

Following this, in circuit boards to be mounted on such electrical equipment, densification of circuits is more and more required. In order to realize such densification of circuit boards, a method for precisely forming a circuit having narrower line width and line spacing (width of a portion between an electrical circuit and an electrical circuit adjacent to each other) is demanded.

In densified wirings, a short circuit or migration between the wirings is easily generated. In addition, with an increase of the lamination number, irregularities generated on a circuit forming plane become large, and fine circuit formation becomes more difficult.

As a fine circuit formation technique, techniques adopting a subtractive process, an additive process, or the like, which are conventional circuit forming methods of printed wiring boards, are known. In addition, in recent years, a novel fine circuit formation technique with using a laser light is proposed (Patent Document 1).

In a conventional circuit formation step of a printed wiring board, a resist material is used, and the resist material is similarly used in the circuit formation step of Patent Document 1.

However, a film thickness of the resist material which is used in Patent Document 1 is thin as from about 1 to 2 μm, so that it is not easy to form a resist coating having a uniform film thickness at the time of actual production. In addition, in general, even in a dry film resist (DFR) which is used as a technique for forming a uniform film, if the film thickness is too thin, there is a concern that it is lacking in reliability from the standpoint of uniformity.

For that reason, if the film thickness of the resist material can be made thick, such is more preferable from the standpoint of production. However, if the film thickness of the resist material is made thick, laser processability or developability is lowered, or there is caused such a problem that precision of a circuit which is formed by means of mechanical processing is lowered, or the like.

For that reason, a resist material in which even if the film thickness of the resist material is made thick, laser processability, developability, and the like are not affected is desired.

Regarding this issue, Patent Document 2 proposes a resin composition in which for the purpose of enhancing laser processability of a resin, an ultraviolet absorber and the like are blended in a thermosetting resin.

However, in the resin composition of Patent Document 2, since a softening temperature of the resin is too high, there is such a problem that after laser processing, the resin composition is cracked, so that a resist performance, namely resistance to plating chemicals, alkali developability, plating formability, and the like are impaired. Thus, it is the actual situation that a resin composition having both laser processability and resist performance is not obtained yet.

BACKGROUND ART DOCUMENT

Patent Document

Patent Document 1: JP-A-2010-135768
Patent Document 2: WO2009/096507A1

SUMMARY OF INVENTION

Problem that Invention is to Solve

In view of the above-described problems, the present invention has been made, and an object of the present invention is to provide a resin composition for laser processing in which ultraviolet laser processability of a resin is enhanced, and a resist performance after laser processing is not impaired, and which can be suitably used as a resist in forming a circuit of a printed wiring board.

Means for Solving Problem

In order to solve the above-described problem, the present inventors made extensive and intensive investigations. As a result, it has been found that by using a thermoplastic resin having a softening temperature in a certain range and blending a specified amount of an ultraviolet absorber, laser processability in forming a circuit by a laser can be enhanced without impairing a resist performance after ultraviolet laser processing, by which the present invention was accomplished.

Specifically, the resin composition for laser processing of the present invention is a composition comprising a resin and an ultraviolet absorber, and in order to solve the above-described problem, the resin is a thermoplastic resin having a carboxyl group and having a softening temperature of from 70 to 140° C., and a content of the ultraviolet absorber is from 1 to 30 parts by mass based on 100 parts by mass of the thermoplastic resin.

In the above-described resin composition for laser processing of the present invention, a copolymer composed of (meth)acrylic acid and styrene and/or an alkyl (meth)acrylate is suitably used as the thermoplastic resin having a carboxyl group.

In addition, it is preferable that the above-described ultraviolet absorber has an absorption wavelength of from 200 to 380 nm.

The resin composition for laser processing of the present invention can further contain a plasticizer, a content of which is preferably from 1 to 30 parts by mass based on 100 parts by mass of the above-described thermoplastic resin.

A resin film for laser processing of the present invention is obtained by coating the above-described resin composition for laser processing of the present invention on a support, followed by drying.

Effects of Invention

In the resin composition for laser processing of the present invention, by containing a specified amount of the ultraviolet absorber in the thermoplastic resin having a carboxyl group, absorption of the laser light in the neighborhood of an ultraviolet wavelength is increased, and laser processability of the resin is enhanced.

In addition, by controlling the softening temperature of the thermoplastic resin, such an effect that the resist performance after laser processing is not impaired is obtained.

In consequence, according to the resin composition for laser processing of the present invention, it becomes possible to enhance the laser processability with maintaining the resist performance after laser processing.

Modes for Carrying out Invention

Embodiments of the present invention are hereunder described. It is to be noted that in the specification of the present application, the term "(meth)acryl" means both acryl and methacryl, and it should be construed that this term is used as a general name unless otherwise the both are distinguished from each other.

Although it should be construed that the thermoplastic resin having a carboxyl group which is used in the present invention is not limited to these examples, examples of the thermoplastic resin having a carboxyl group which is used in the present invention include diene-based resins such as styrene-butadiene-based copolymers, etc.; acrylic resins such as (meth)acrylic acid ester-based copolymers, etc.; and polyester-based resins, all of which have a carboxyl group in a molecule thereof; and the like.

Examples of the above-described (meth)acrylic acid ester include acrylates containing an alkyl group(s) such as methyl (meth)acrylate, ethyl (meth)acrylate, n-butyl (meth)acrylate, t-butyl (meth)acrylate, hexyl (meth)acrylate, 2-ethylhexyl (meth)acrylate, n-octyl (meth)acrylate, n-nonyl (meth)acrylate, n-decyl (meth)acrylate, cyclohexyl (meth)acrylate, etc.; aromatic (meth)acrylates such as benzyl (meth)acrylate, phenoxyethyl acrylate, etc.; (meth)acrylates containing an amino group(s) such as dimethylaminoethyl (meth)acrylate, etc.; (meth)acrylates containing a hydroxyl group(s) such as 2-hydroxyethyl (meth)acrylate, 2-hydroxypropyl (meth)acrylate, 4-hydroxybutyl (meth)acrylate, etc.; (meth)acrylates containing an epoxy group(s) such as glycidyl (meth)acrylate, etc.; and the like. These can be used solely, or can also be used in combination of two or more kinds thereof. Above all, ethyl (meth)acrylate, n-butyl (meth)acrylate, and 2-ethylhexyl (meth)acrylate are preferably used from the standpoint that the softening temperature can be easily controlled.

In addition, a copolymer of (meth)acrylic acid and styrene and/or an alkyl (meth)acrylate is preferable from the standpoints that adhesion to a base material is good, and the softening temperature can be easily controlled.

The above-described thermoplastic resin having a carboxyl group has a softening temperature of preferably from 70 to 140° C., and more preferably from 70° C. to 120° C. When the softening temperature is higher than 140° C., a tendency that a resist performance after laser processing is impaired is generated, whereas when it is lower than 70° C., a tendency that in a plating treatment step, resistance to the plating solution becomes weak is generated.

In addition, the above-described thermoplastic resin preferably has an acid value in the range of from 100 to 300 mgKOH/g. When the acid value is too low, there is a concern that resist developability is insufficient, whereas when it is too high, a tendency that resistance to a developing solution is lowered, and a lowering of adhesion to a base material is brought is generated.

Next, specific examples of the ultraviolet absorber which is used in the present invention include benzotriazole-based ultraviolet absorbers, benzophenone-based ultraviolet absorbers, salicylate-based ultraviolet absorbers, cyano acrylate-based ultraviolet absorbers, triazine-based ultraviolet absorbers, and the like; however, it should not be construed that the ultraviolet absorber is limited thereto. From the standpoint of enhancing the laser processability, it is preferable to select an ultraviolet absorber having an absorption band in a wavelength region of an ultraviolet laser to be used. For example, in the case of using a UV-YAG laser (laser wavelength: 355 nm) for a laser processing machine, it is preferable to use an ultraviolet absorber having absorption in an ultraviolet wavelength region of from 200 to 380 nm and having absorption maximum in an ultraviolet wavelength region of 355 nm. Specifically, a benzotriazole-based or triazine-based ultraviolet absorber having absorption maximum in the neighborhood of 355 nm is preferable.

Specific examples of the above-described benzotriazole-based ultraviolet absorber include 2-(2'-hydroxy-5'-methylphenyl)benzotriazole, 2-(2'-hydroxy-5'-t-butylphenyl)benzotriazole, 2-(2'-hydroxy-5'-octylphenyl)benzotriazole, 2-(2'-hydroxy-3'-t-butyl-5'-methylphenyl)-5-chlorobenzotriazole, 2-(2'-hydroxy-3',5'-di-t-butylphenyl)benzotriazole, 2-(2'-hydroxy-3',5'-di-t-butylphenyl)-5-chlorobenzotriazole, 2-(2'-hydroxy-3',5'-di-t-amylphenyl)benzotriazole, 2-(2'-hydroxy-3',5'-dicumylphenyl)phenylbenzotriazole, 2-(2'-hydroxy-4'-di-t-octoxyphenyl)benzotriazole, 2-(2H-benzotriazol-2-yl)-6-dodecyl-4-methylphenol, and the like. Above all, 2-(2H-benzotriazol-2-yl)-6-dodecyl-4-methylphenol is liquid at room temperature and is preferably used from the viewpoint of handling properties or an affinity with the thermoplastic resin.

In addition, examples of the above-described triazine-based ultraviolet absorber include hydroxyphenyltriazine, 2,4-bis[2-hydroxy-4-butoxyphenyl]-6-(2,4-dibutoxyphenyl)-1,3,5-triazine, 2,4-diphenyl-6-(2-hydroxy-4-hexyloxyphenyl)-1,3,5-triazine, and the like.

The above-described ultraviolet absorber can be used solely, or can also be used in combination of two or more kinds thereof.

A content of such an ultraviolet absorber is preferably from 1 to 30 parts by mass, and more preferably from 10 to 30 parts by mass based on 100 parts by mass of the thermoplastic resin having a carboxyl group (calculated as a solid content, hereinafter the same). When the content is less than 1 part by mass, the effect for enhancing the laser processability is small, whereas when it exceeds 30 parts by mass, a tendency that a problem in an affinity with the resin is caused is generated.

If desired, the resin composition for laser processing of the present invention can further contain a plasticizer. Although the plasticizer to be contained is not particularly limited, examples thereof include phthalic acid ester-based plasticizers, trimellitic acid ester-based plasticizers, aliphatic dibasic acid ester-based plasticizers, phosphoric acid ester-based plasticizers, and the like.

Specific examples of the above-described phthalic acid ester-based plasticizer include dimethyl phthalate, diethyl phthalate, dibutyl phthalate, bis(2-ethylhexyl) phthalate, diisodecyl phthalate, butylbenzyl phthalate, diisononyl phthalate, ethylphthalylethyl glycolate, and the like.

Specific examples of the above-described trimellitic acid ester-based plasticizer include tris(2-ethylhexyl) trimellitate and the like.

Specific examples of the above-described aliphatic dibasic acid ester-based plasticizer include dibutyl adipate, diisobutyl adipate, bis(2-ethylhexyl) adipate, diisononyl adipate, diisodecyl adipate, bis(2-ethylhexyl) azelate, bis(2-ethylhexyl) sebacate, diethyl succinate, and the like.

Specific examples of the above-described phosphoric acid ester-based plasticizer include trimethyl phosphate, triethyl phosphate, tributyl phosphate, tris(2-ethylhexyl) phosphate, triphenyl phosphate, tricresyl phosphate, trixylenyl phosphate, cresyldiphenyl phosphate, 2-ethylhexyldiphenyl phosphate, and the like.

The above-described plasticizer can be used solely, or can also be used in combination of two or more kinds thereof.

In the case of using the plasticizer, a blending amount thereof is preferably from 1 to 30 parts by mass based on 100 parts by mass of the thermoplastic resin having a carboxyl group. When the blending amount of the plasticizer is less than 1 part by mass, a plasticizing effect of the resin is small, whereas when it exceeds 30 parts by mass, a problem in an affinity with the resin is caused, and there is a concern that in a plating treatment step, resistance to a plating solution becomes weak due to a lowering of a softening temperature of the resin composition.

It is to be noted that if desired, additives such as a stabilizer, a flame retardant, etc. can be further used in the resin composition for laser processing of the present invention within the range where the gist of the invention is not deviated.

The resin composition for laser processing of the present invention can be used as it is as an ink (liquid resist) to be coated on a circuit board, and it can also be used as a resin film for laser processing, which is obtained by coating the resin composition for laser processing on a support, followed by drying.

The resin film for laser processing which is obtained from the resin composition for laser processing of the present invention can be used solely as a film, or it can also be used as a resin laminate for laser processing obtained by forming a layer of the resin composition for laser processing of the present invention on a support film, drying, and further laminating a protective film.

The above-described support film is not particularly limited so long as it has flexibility and is endurable against coating and drying, and examples thereof include a polyester film such as a polyethylene terephthalate (PET) film, etc., an oriented polypropylene (OPP) film, and the like.

In addition, the above-described protective film plays a role for preventing separation or floating of the resin film from the support film from occurring on the occasion of making the resin laminate for laser processing into a roll form. For example, a polyolefin film such as a polyethylene (PE) film, a polypropylene (PP) film, etc., a PET film, a polytetrafluoroethylene (PTFE) film, a polyvinyl alcohol film, a nylon film, and the like are useful, and above all, a polyolefin film is preferably used.

Coating of the above-described resin composition for laser processing on the support, drying, lamination, and the like can be conducted according to the ordinary method and are not particularly limited. Examples of the preferred coating method include a roll coating method and a flow coating method, and drying may be conducted at ordinary temperature or under heating, if desired.

EXAMPLES

Although the present invention is more specifically described below by reference to the Examples, it should not be construed that the present invention is limited to the following Examples. It is to be noted that in the following, the term "part" means "part by mass" unless otherwise indicated.

Synthesis Examples (Thermoplastic Resin A-1)

In a reaction apparatus equipped with a stirrer, a thermometer, a reflux condenser, a dropping device, and a nitrogen inlet tube, a nitrogen gas was enclosed, and thereafter, 120 parts of methyl isobutyl ketone, 30 parts of isopropyl alcohol, 27 parts of acrylic acid, 55 parts of styrene, 18 parts of 2-ethylhexyl acrylate, and 2,2'-azobisisobutyronitrile (a trade name: V-60, manufactured by Wako Pure Chemical Industries, Ltd.) which is an azo-based polymerization initiator were charged. The contents were polymerized in a nitrogen gas stream with stirring at 80° C. for 12 hours, thereby obtaining a thermoplastic resin A-1. The obtained thermoplastic resin A-1 was found to have a weight average molecular weight (measured by GPC, hereinafter the same) of 30,000 and a softening temperature (measured by a flow tester, hereinafter the same) of 108° C.

(Thermoplastic Resin A-2)

In a reaction apparatus equipped with a stirrer, a thermometer, a reflux condenser, a dropping device, and a nitrogen inlet tube, a nitrogen gas was enclosed, and thereafter, 58 parts of methyl isobutyl ketone, 14 parts of isopropyl alcohol, 27 parts of acrylic acid, 55 parts of styrene, 18 parts of 2-ethylhexyl acrylate, and 2,2'-azobisisobutyronitrile (a trade name: V-60, manufactured by Wako Pure Chemical Industries, Ltd.) which is an azo-based polymerization initiator were charged. The contents were polymerized in a nitrogen gas stream with stirring at 75° C. for 12 hours, thereby obtaining a thermoplastic resin A-2. The obtained thermoplastic resin A-2 was found to have a weight average molecular weight of 50,000 and a softening temperature of 104° C.

(Thermoplastic Resin A-3)

In a reaction apparatus equipped with a stirrer, a thermometer, a reflux condenser, a dropping device, and a nitrogen inlet tube, a nitrogen gas was enclosed, and thereafter, 120 parts of methyl isobutyl ketone, 30 parts of isopropyl alcohol, 27 parts of acrylic acid, 39 parts of styrene, 34 parts of 2-ethylhexyl acrylate, and 2,2'-azobisisobutyronitrile (a trade name: V-60, manufactured by Wako Pure Chemical Industries, Ltd.) which is an azo-based polymerization initiator were charged. The contents were polymerized in a nitrogen gas stream with stirring at 80° C. for 12 hours, thereby obtaining a thermoplastic resin A-3. The obtained thermoplastic resin A-3 was found to have a weight average molecular weight of 30,000 and a softening temperature of 86° C.

(Thermoplastic Resin A-4)

In a reaction apparatus equipped with a stirrer, a thermometer, a reflux condenser, a dropping device, and a nitrogen inlet tube, a nitrogen gas was enclosed, and thereafter, 120 parts of methyl isobutyl ketone, 30 parts of isopropyl alcohol, 33 parts of acrylic acid, 67 parts of styrene, and 2,2'-azobisisobutyronitrile (a trade name: V-60, manufactured by Wako Pure Chemical Industries, Ltd.) which is an azo-based polymerization initiator were charged. The contents were polymerized in a nitrogen gas stream with stirring at 75° C. for 12 hours, thereby obtaining a thermoplastic resin A-4. The obtained thermoplastic resin A-4 was found to have a weight average molecular weight of 40,000 and a softening temperature of 101° C.

(Thermoplastic Resin A-5)

In a reaction apparatus equipped with a stirrer, a thermometer, a reflux condenser, a dropping device, and a nitrogen inlet tube, a nitrogen gas was enclosed, and thereafter, 120 parts of methyl isobutyl ketone, 30 parts of isopropyl alcohol, 27 parts of acrylic acid, 39 parts of styrene, 34 parts of butyl acrylate, and 2,2'-azobisisobutyronitrile (a trade name: V-60, manufactured by Wako Pure Chemical Industries, Ltd.) which is an azo-based polymerization initiator were charged. The contents were polymerized in a nitrogen gas stream with stirring at 80° C. for 12 hours, thereby obtaining a thermoplastic resin A-5. The obtained thermoplastic resin A-5 was found to have a weight average molecular weight of 30,000 and a softening temperature of 86° C.

(Thermoplastic Resin A-6)

In a reaction apparatus equipped with a stirrer, a thermometer, a reflux condenser, a dropping device, and a nitrogen inlet tube, a nitrogen gas was enclosed, and thereafter, 120 parts of methyl isobutyl ketone, 30 parts of isopropyl alcohol, 32 parts of methacrylic acid, 39 parts of styrene, 29 parts of butyl methacrylate, and 2,2'-azobisisobutyronitrile (a trade name: V-60, manufactured by Wako Pure Chemical Industries, Ltd.) which is an azo-based polymerization initiator were charged. The contents were polymerized in a nitrogen gas stream with stirring at 80° C. for 12 hours, thereby obtaining a thermoplastic resin A-6. The obtained thermoplastic resin A-6 was found to have a weight average molecular weight of 30,000 and a softening temperature of 118° C.

Examples and Comparative Examples

The above-described thermoplastic resin A-1, A-2, A-3, A-4, A-5 or A-6, 2-(2H-benzotriazol-2-yl)-6-dodecyl-4-methylphenol (a trade name: TINUVIN 571, manufactured by BASF, maximum absorption wavelength: 344 nm) as an ultraviolet absorber B, and trixylenyl phosphate (a trade name: TXP, manufactured by Daihachi Chemical Industry Co., Ltd.) as a plasticizer C-1, bis(2-ethylhexyl) phthalate (a trade name: DOP, manufactured by Daihachi Chemical Industry Co., Ltd.) as a plasticizer C-2, bis(2-ethylhexyl) adipate (a trade name: DOA, manufactured by Daihachi Chemical Industry Co., Ltd.) as a plasticizer C-3, or tris(2-ethylhexyl) trimellitate (a trade name: TOTM, manufactured by Daihachi Chemical Industry Co., Ltd.) as a plasticizer C-4 were blended, respectively in a composition shown in Table 1, thereby preparing resin compositions for laser processing of the Examples and Comparative Examples. The obtained resin compositions for laser processing were measured and evaluated in the following manners. The evaluation results are shown in Table 1.

<Softening Temperature>

The softening temperature was measured by using a flow tester, manufactured by Shimadzu Corporation.

<Laser Processability>

The above-obtained resin composition for laser processing (resist composition) was coated on a surface of an epoxy-based insulating resin base material having a thickness of 100 μm, thereby forming a coating having a film thickness after drying of 5 μm. Then, the insulating resin base material having a coating formed thereon was subjected to groove formation processing with a substantially rectangular cross section having a width of 20 μm and a depth of 30 μm by means of laser processing, and an exposed state of the surface of the insulating resin base material and a state of the circuit groove were observed by an SEM (scanning electron microscope) and evaluated according to the following criteria. It is to be noted that a UV-YAG laser was used for the laser processing.

A: Exposure of the insulating resin base material is not observed, and a residue of the resist resin does not exist in the circuit groove.

B: Exposure of the insulating resin base material is observed, or a residue of the resist resin exists in the circuit groove.

<Rising Rate of Resist Resin Coating>

A film thickness (μm) of the resist resin coating was measured before and after the laser processing, respectively, and a rising rate was determined according to the following equation.

Rising rate=(Film thickness of resist resin after laser processing)/(Film thickness of resist resin before laser processing)

<Resistance to Plating Chemicals>

The above-described insulating resin base material having a groove formed thereon was dipped in a cleaner conditioner (surfactant solution, a trade name: C/N3320, manufactured by Rohm and Haas Electronic Materials LLC, pH: lower than 1) and then washed with water. Subsequently, a soft etching treatment with a sodium persulfate-sulfuric acid-based soft etching agent (pH: lower than 1) was carried out. Subsequently, a pre-dipping treatment with PD404 (manufactured by Shipley Far East Ltd., pH: lower than 1) was carried out. Subsequently, by dipping in an acidic Pd-Sn colloid solution containing stannous chloride and palladium chloride (a trade name: CAT44, manufactured by Shipley Far East Ltd., pH: 1), palladium serving as a nucleus of electroless copper plating was adsorbed in a state of the tin-palladium colloid on the insulating resin base material. Subsequently, by dipping in an accelerator chemical liquid (a trade name: ACC19E, manufactured by Shipley Far East Ltd., pH: lower than 1), a palladium nucleus was generated. Thereafter, the surface of the insulating resin base material was observed through visual inspection, and a state of the resist resin was evaluated according to the following criteria.

A: Neither separation nor cracking of the resist resin was generated.

B: Separation or cracking of the resist resin was generated.

<Alkali Developability>

The insulating resin base material having a palladium nucleus generated therein was subjected to resist separation by spraying a 3% sodium hydroxide aqueous solution at 30° C., and a state of the separation was evaluated according to the following criteria.

A: A residue of the resist resin does not exist on the insulating resin base material.

B: A residue of the resist resin exists on the insulating resin base material.

<Plating Formability>

The insulating resin base material from which the resist had been separated was subjected to an electroless copper plating treatment by dipping in an electroless plating solution (a trade name: CM328A, CM328L, CM328C, manufactured by Shipley Far East Ltd.), thereby precipitating an electroless copper-plated film having a film thickness of from 3 to 5 μm. Thereafter, the surface of the insulating resin base material was observed, and a formation state of the plated film was evaluated according to the following criteria.

A: A plated film was formed in only a cutting-processed portion.

B: A plated film was also formed in other portions than a cutting-processed portion, or a plated film was not formed in a cutting-processed portion.

TABLE 1

| | Thermoplastic resin | | | | | | Ultraviolet absorber | Plasticizer | | | |
|---|---|---|---|---|---|---|---|---|---|---|---|
| | A-1 | A-2 | A-3 | A-4 | A-5 | A-6 | B | C-1 | C-2 | C-3 | C-4 |
| Example 1 | 100 | | | | | | 1 | | | | |
| Example 2 | 100 | | | | | | 5 | | | | |
| Example 3 | 100 | | | | | | 10 | | | | |
| Example 4 | 100 | | | | | | 30 | | | | |
| Example 5 | 100 | | | | | | 10 | 10 | | | |
| Example 6 | | 100 | | | | | 10 | 10 | | | |
| Example 7 | | | | | 100 | | 10 | 10 | | | |
| Example 8 | 100 | | | | | | 10 | 20 | | | |
| Example 9 | | 100 | | | | | 10 | 20 | | | |
| Example 10 | | | | 100 | | | 10 | 20 | | | |
| Example 11 | | | | | | 100 | 10 | 20 | | | |
| Example 12 | 100 | | | | | | 10 | | 20 | | |
| Example 13 | 100 | | | | | | 10 | | | 20 | |
| Example 14 | 100 | | | | | | 10 | | | | 20 |
| Comparative Example 1 | 100 | | | | | | | | | | |
| Comparative Example 2 | 100 | | | | | | 0.1 | | | | |
| Comparative Example 3 | 100 | | | | | | 30 | | | | |
| Comparative Example 4 | | 100 | | | | | | | | | |
| Comparative Example 5 | | 100 | | | | | 30 | | | | |

| | Softening temperature of compotition (° C.) | Laser processablitiy | Rising rate of resist resin | Resistance to plating chemicals | Alkali developability | Plating formability |
|---|---|---|---|---|---|---|
| Example 1 | 107 | A | 1.5 | A | A | A |
| Example 2 | 102 | A | 1.2 | A | A | A |
| Example 3 | 94 | A | 1.2 | A | A | A |
| Example 4 | 81 | A | 1.0 | A | A | A |
| Example 5 | 83 | A | 1.3 | A | A | A |
| Example 6 | 65 | A | 1.3 | A | A | A |
| Example 7 | 65 | A | 1.3 | A | A | A |
| Example 8 | 72 | A | 1.3 | A | A | A |
| Example 9 | 69 | A | 1.4 | A | A | A |
| Example 10 | 69 | A | 1.3 | A | A | A |
| Example 11 | 80 | A | 1.4 | A | A | A |
| Example 12 | 70 | A | 1.3 | A | A | A |
| Example 13 | 63 | A | 1.3 | A | A | A |
| Example 14 | 85 | A | 1.4 | A | A | A |
| Comparative Example 1 | 108 | B | 2.1 | A | B | B |
| Comparative Example 2 | 106 | B | 1.8 | A | B | B |
| Comparative Example 3 | 73 | B | 2.0 | A | B | B |
| Comparative Example 4 | 104 | B | 2.3 | A | B | B |
| Comparative Example 5 | 69 | B | 2.2 | A | B | B |

As is noted from the results shown in Table 1, it could be confirmed that in the resin composition for laser processing of the present invention, by adding an ultraviolet absorber to a thermoplastic resin having a softening temperature of from 70° C. to 140° C., it is possible to conspicuously enhance laser processability with maintaining a resist performance after laser processing.

INDUSTRIAL APPLICABILITY

Since the resin composition of the present invention is able to enhance laser processability of the resin with maintaining a resist performance, it is useful as a resist to be used at the time of forming a circuit of a printed wiring board using a laser.

The invention claimed is:

1. A resin composition for laser processing comprising a thermoplastic resin and an ultraviolet absorber, wherein the thermoplastic resin is a copolymer composed of (meth) acrylic acid and styrene and/or an alkyl (meth)acrylate, said thermoplastic resin further having a softening temperature of from 70 to 140° C. and having an acid value of from 100 to 300 mgKOH/g, and a content of the ultraviolet absorber is from 1 to 30 parts by mass based on 100 parts by mass of the thermoplastic resin.

2. The resin composition for laser processing according to claim 1, wherein the ultraviolet absorber has an absorption wavelength of from 200 to 380 nm.

3. The resin composition for laser processing according to claim 1, further comprising a plasticizer wherein a content of the plasticizer is from 1 to 30 parts by mass based on 100 parts by mass of the thermoplastic resin.

4. A resin film for laser processing, which is obtained by coating the resin composition for laser processing according to claim 1 on a support, followed by drying.

5. The resin composition for laser processing according to clam 2, further comprising a plasticizer wherein a content of the plasticizer is from 1to 30 parts by mass based on 100 parts by mass of the thermoplastic resin.

6. A resin film for laser processing, which is obtained by coating the resin composition for laser processing according to claim 2 on a support, followed by drying.

7. A resin film for laser processing, which is obtained by coating the resin composition for laser processing according to claim 3 on a support, followed by drying.

\* \* \* \* \*